United States Patent
Brick et al.

(10) Patent No.: US 9,985,188 B2
(45) Date of Patent: May 29, 2018

(54) OPTOELECTRONIC COMPONENT

(71) Applicant: OSRAM Opto Semiconductors GmbH, Regensburg (DE)

(72) Inventors: Peter Brick, Regensburg (DE); Ulrich Streppel, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 5 days.

(21) Appl. No.: 15/510,468

(22) PCT Filed: Sep. 4, 2015

(86) PCT No.: PCT/EP2015/070205
§ 371 (c)(1),
(2) Date: Mar. 10, 2017

(87) PCT Pub. No.: WO2016/041784
PCT Pub. Date: Mar. 24, 2016

(65) Prior Publication Data
US 2017/0256691 A1    Sep. 7, 2017

(30) Foreign Application Priority Data

Sep. 15, 2014  (DE) .................... 10 2014 113 275

(51) Int. Cl.
*H01L 33/60* (2010.01)
*H01L 33/48* (2010.01)
*H01L 33/50* (2010.01)

(52) U.S. Cl.
CPC ............ *H01L 33/60* (2013.01); *H01L 33/483* (2013.01); *H01L 33/507* (2013.01)

(58) Field of Classification Search
CPC ....... H01L 33/60; H01L 33/507; H01L 33/483
See application file for complete search history.

(56) References Cited

U.S. PATENT DOCUMENTS

| 7,806,547 | B2 | 10/2010 | Benitez et al. | |
| 2004/0036990 | A1* | 2/2004 | Hanano | G02B 5/045 359/831 |
| 2004/0218390 | A1* | 11/2004 | Holman | G02B 5/045 362/245 |
| 2007/0002453 | A1 | 1/2007 | Munro | |
| 2007/0012934 | A1 | 1/2007 | Abu-Ageel | |

(Continued)

FOREIGN PATENT DOCUMENTS

| CN | 202259431 U | 5/2012 |
| JP | 2010-122372 A | 6/2010 |

(Continued)

OTHER PUBLICATIONS

German Search Report dated Jun. 17, 2015 in corresponding German Application No. 10 2014 113 275.0.

*Primary Examiner* — Kyoung Lee
*Assistant Examiner* — Christina Sylvia
(74) *Attorney, Agent, or Firm* — DLA Piper LLP (US)

(57) ABSTRACT

An optoelectronic component includes a housing including a base section and a cover section that delimit an interior of the housing, wherein an optoelectronic semiconductor chip is arranged on the base section, the cover section is formed by an optical element, and a reflective element including openings is arranged between the optoelectronic semiconductor chip and an outer side of the optical element.

18 Claims, 6 Drawing Sheets

(56) References Cited

U.S. PATENT DOCUMENTS

| | | | |
|---|---|---|---|
| 2007/0242441 A1* | 10/2007 | Aldrich | H05K 1/111 |
| | | | 361/782 |
| 2011/0122599 A1 | 5/2011 | Lin et al. | |
| 2013/0015482 A1 | 1/2013 | Su | |
| 2013/0114267 A1 | 5/2013 | Ho et al. | |
| 2013/0193592 A1 | 8/2013 | Peil et al. | |
| 2014/0084325 A1 | 3/2014 | Yamanaka et al. | |

FOREIGN PATENT DOCUMENTS

| | | |
|---|---|---|
| JP | 2013-254649 A | 12/2013 |
| WO | 2013/046081 A1 | 4/2013 |

* cited by examiner

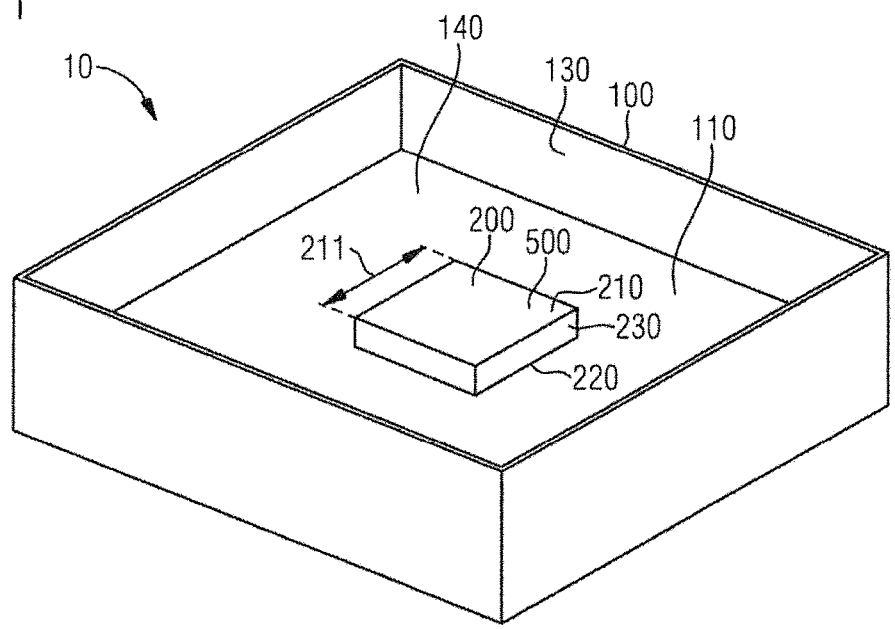
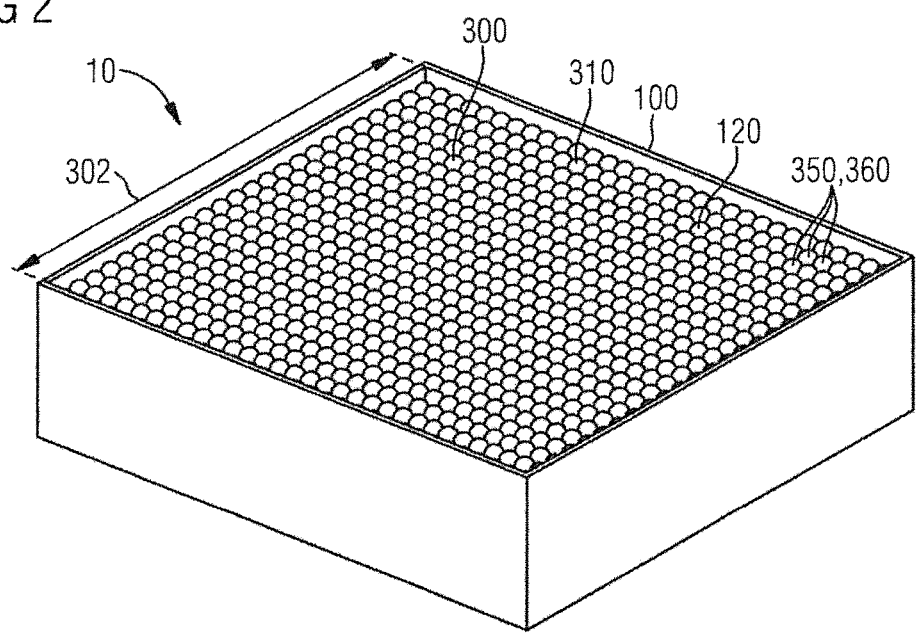

OPTOELECTRONIC COMPONENT

TECHNICAL FIELD

This disclosure relates to an optoelectronic component.

BACKGROUND

It is known to equip photographic cameras with flashlight devices comprising light emitting diode components. Such flashlight devices are used in particular in photographic cameras integrated into cellular phones and in other photographic cameras comprising housings comprising limited spatial dimensions. It is therefore desirable for the flashlight devices themselves to be configured as compactly as possible, in particular with a small structural height. A high color homogeneity of the light emitted by the flashlight device is likewise desirable.

SUMMARY

We provide an optoelectronic component including a housing including a base section and a cover section that delimit an interior of the housing, wherein an optoelectronic semiconductor chip is arranged on the base section, the cover section is formed by an optical element, and a reflective element including openings is arranged between the optoelectronic semiconductor chip and an outer side of the optical element.

BRIEF DESCRIPTION OF THE DRAWINGS

FIG. 1 shows a perspective view of an optoelectronic component.

FIG. 2 shows a perspective view of the optoelectronic component together with a cover section.

LIST OF REFERENCE SIGNS

Figure 3:
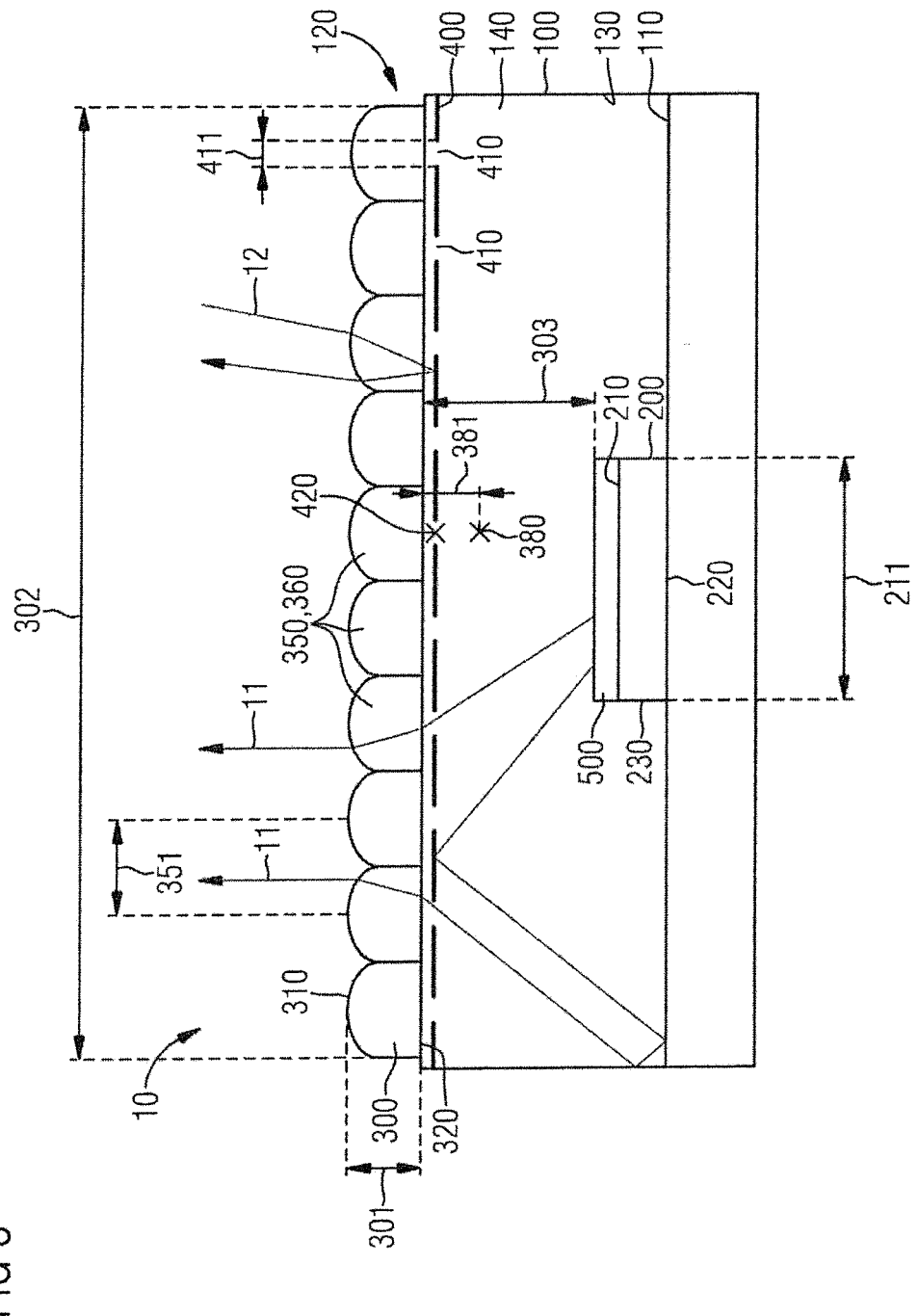
FIG. 3 shows a sectional side view of another optoelectronic component.

10 Optoelectronic component
11 Emitted light ray
12 External light ray
100 Housing
110 Base section
120 Cover section
130 Wall section
140 Interior
200 Optoelectronic semiconductor chip
210 Radiation emission face
211 Edge length
220 Base face
230 Side face
300 Optical element
301 Thickness
302 Edge length
303 Distance
310 Outer side
320 Inner side
330 Cavity
331 First cavity
332 Second cavity
333 Third cavity
350 Optical individual element
351 Distance
360 Optical lens
370 Optical taper
371 Outer face
380 Focal point
381 Distance
400 Reflective element
410 Opening
411 Diameter
420 Center point
500 Wavelength-converting material
510 Diffusely scattering material
600 Further optical element
610 Further optical individual elements

DETAILED DESCRIPTION

Our optoelectronic component comprises a housing comprising a base section and a cover section that delimit an interior of the housing. An optoelectronic semiconductor chip is arranged on the base section. The cover section is formed by an optical element. A reflective element comprising openings is arranged between the optoelectronic semiconductor chip and an outer side of the optical element.

This optoelectronic component may serve, for example, as a flashlight device in a photographic camera, a video camera, a cellular phone or in some other camera. The optical element of the optoelectronic component serves to direct light emitted by the optoelectronic semiconductor chip of the optoelectronic component into a target region to be illuminated. The reflective element of the optoelectronic component may reflect light impinging on the cover section of the optoelectronic component from outside, as a result of which the interior of the housing of the optoelectronic component and the optoelectronic semiconductor chip of the optoelectronic component arranged in the interior of the housing are substantially not discernible from outside the optoelectronic component. Moreover, the reflective element may reflect part of the light emitted by the optoelectronic semiconductor chip within the interior of the housing of the optoelectronic component to achieve a homogeneous intermixing of the light and thus a homogeneous emission of the optoelectronic component. The optoelectronic component may advantageously comprise very compact external dimensions, in particular a small thickness in a direction perpendicular to the cover section of the housing of the optoelectronic component. The optoelectronic component may advantageously be produced cost-effectively and in large numbers. In particular, the optical element and the reflective element of the optoelectronic component may be produced cost-effectively at the wafer level.

The reflective element may be configured such that it is specularly or diffusely reflective. Advantageously, the reflective element in both variants may both reflect light impinging on the cover section of the housing of the optoelectronic component from outside and reflect part of a light emitted by the optoelectronic semiconductor chip of the optoelectronic component within the interior of the housing of the optoelectronic component to achieve a homogeneous intermixing of the light emitted by the optoelectronic semiconductor chip.

The optical element may comprise a planar side facing the optoelectronic semiconductor chip. In this case, the reflective element is arranged on the planar side. Advantageously, this enables simple production of the optical element and the reflective element. Arrangement of the reflective element on the planar side of the optical element additionally makes it possible to define a distance between the reflective element and the optical element and also an alignment of the reflective element and the optical element relative to one another with high accuracy. The arrangement of the reflective element on the planar side of the optical element additionally makes it possible to configure the optoelectronic component overall with a small thickness in a direction perpendicular to the cover section of the housing of the optoelectronic component.

The reflective element may be laminated, printed or applied as a metallization on the planar side of the optical element. Advantageously, this enables particularly simple and cost-effective production of the reflective element and the optical element.

The reflective element may at least be partly embedded into the optical element. Advantageously, this also enables simple and cost-effective production of the reflective element and the optical element. By at least partly embedding the reflective element into the optical element, it is additionally possible to define the distance between the reflective element and the optical element and also alignment of the reflective element and optical element relative to one another with high accuracy. Embedding the reflective element into the optical element additionally makes it possible to configure the housing of the optoelectronic component with a very small thickness in a direction perpendicular to the cover section of the housing.

The optical element may comprise a plurality of cavities arranged between the optoelectronic semiconductor chip and the reflective element. In this case, a wavelength-converting material is respectively arranged in the cavities. The wavelength-converting material may convert electromagnetic radiation emitted by the optoelectronic semiconductor chip of the optoelectronic component at least partly into electromagnetic radiation of a different, typically longer, wavelength. As a result, white light may be generated, for example, from light emitted by the optoelectronic semiconductor chip and comprises a wavelength from the blue or ultraviolet spectral range. The arrangement of the wavelength-converting material in cavities of the optical element enables simple and cost-effective production of the optoelectronic component. The presence of a plurality of cavities additionally makes it possible to arrange different wavelength-converting material in different cavities to achieve, for example, conversion of light emitted by the optoelectronic semiconductor chip into light of different wavelengths.

A diffusely scattering material may additionally be arranged in at least one of the cavities. The diffusely scattering material arranged in the cavity may serve to achieve a further homogeneous intermixing of the light emitted by the optoelectronic semiconductor chip of the optoelectronic component.

The openings of the reflective element may comprise a round or a rectangular cross section. Advantageously, shaping the cross sections of the openings of the reflective element of the optoelectronic component makes it possible to influence light distribution of the light emitted by the optoelectronic component in a target region.

The openings of the reflective element may be arranged in a regular lattice arrangement, preferably in a rectangular or hexagonal lattice arrangement. This makes it possible to configure the reflective element with a particularly high number of openings, wherein at the same time a defined minimum distance between the openings of the reflective element may be maintained. The regular lattice arrangement of the openings of the reflective element may advantageously additionally bring about a homogeneous external appearance of the optoelectronic component.

The optical element may comprise a plurality of optical individual elements arranged alongside one another. Advantageously, the optical element may thereby be configured with more compact external dimensions than would be possible in an example of the optical element as just a single individual element. In particular, the optical element may be configured with a small thickness in a direction perpendicular to the cover section of the housing of the optoelectronic component. The configuration of the optical element comprising a plurality of optical individual elements arranged alongside one another moreover opens additional degrees of freedom in the design of the beam shaping brought about by the optical element of the optoelectronic component.

An opening of the reflective element may be assigned to each optical individual element of the optical element. This makes it possible for the respective optical individual element of the optical element to bring about a beam shaping of light emerging from the interior of the housing through the assigned opening of the reflective element.

Each optical individual element may comprise a focal point spaced apart from a center point of the assigned opening of the reflective element by not more than double the diameter of the opening, preferably by not more than the single diameter of the opening. This advantageously ensures that light passing through the respective opening of the reflected element may be directed by the optical individual element of the optical element effectively into a target region in the surroundings of the optoelectronic component.

The optical individual elements may be configured as optical lenses. By way of example, the optical individual elements may be configured as optical converging lenses, for example, as spherical optical converging lenses.

The optical individual elements may be configured as optical tapers. In this case, the individual optical tapers may widen, for example, toward the outer side of the optical element. Light passing into the optical tapers at the longitudinal ends facing the optoelectronic semiconductor chip of the optoelectronic component may be reflected at side walls of the tapers and thereby be homogeneously intermixed and guided to the outer side of the optical element.

The optical individual elements of the optical element may differ from one another. This advantageously results in additional freedoms in the design of the beam shaping brought about by the optical element of the optoelectronic component. The differently configured optical individual elements of the optical element may direct portions of the light emitted by the optoelectronic semiconductor chip of the optoelectronic component in different spatial directions. The beam portions directed by different optical individual elements of the optical element may also comprise different beam divergences.

A wavelength-converting material may be arranged on a radiation emission face of the optoelectronic semiconductor chip and/or on side faces of the optoelectronic semiconductor chip perpendicular to the radiation emission face, and/or on the base section of the housing and/or on a side of the reflective element facing the optoelectronic semiconductor chip. The wavelength-converting material may conduct light emitted by the optoelectronic semiconductor chip of the optoelectronic component into light comprising a different, typically longer, wavelength. As a result, white light may be generated, for example, from light generated by the optoelectronic semiconductor chip and comprising a wavelength from the blue or ultraviolet spectral range.

The base section may be configured such that it is reflective. Advantageously, light emitted by the optoelectronic semiconductor chip may thereby be homogeneously intermixed by reflection at the base section of the housing, as a result of which a high homogeneity of the light emitted toward the outside by the optoelectronic component may be achieved.

The interior may be delimited by a wall section extending between the base section and the cover section, the wall section being configured such that it is reflective. Advantageously, the light emitted by the optoelectronic semiconductor chip of the optoelectronic component may thereby be reflected at the wall section of the housing configured such that it is reflective, as a result of which a homogeneous intermixing of the light in the interior of the housing of the optoelectronic component may be achieved. This supports homogeneity of the light emitted toward the outside by the optoelectronic component.

The optoelectronic component may comprise a further optical element arranged between the optoelectronic semiconductor chip and the reflective element to direct electromagnetic radiation into the openings of the reflective element. This advantageously facilitates a coupling-out of light emitted by the optoelectronic semiconductor chip from the interior of the housing of the optoelectronic component, without in the process reducing the reflection (brought about by the reflective element) of light impinging on the cover section of the housing of the optoelectronic component from outside.

A further optoelectronic semiconductor chip may be arranged on the base section. The brightness of the light emittable by the optoelectronic component may advantageously be increased as a result. The optoelectronic semiconductor chip and the further optoelectronic semiconductor chip of the optoelectronic component may also be configured to generate light comprising different wavelengths. The reflective element of the optoelectronic component may bring about homogeneous intermixing of the light of both optoelectronic semiconductor chips. The light emitted by the optoelectronic component then advantageously comprises portions of the light generated by both optoelectronic semiconductor chips and may thereby bring about, for example, a particularly good white impression.

The above-described properties, features and advantages and the way in which they are achieved will become clearer and more clearly understood in association with the following description of the examples explained in greater detail in association with the drawings.

FIGS. 1 and 2 show schematic perspective illustrations of an optoelectronic component 10. FIG. 3 shows a schematic sectional side view of the optoelectronic component 10. FIG. 1 shows the optoelectronic component 10 in an opened illustration.

The optoelectronic component 10 illuminates a target region with visible light. The optoelectronic component 10 may be, for example, a flashlight device in a photographic and/or video camera, in particular, for example, a flashlight device for a camera integrated into a cellular phone.

The optoelectronic component 10 comprises a housing 100. The housing 100 comprises a base section 110 and a cover section 120 substantially parallel to the base section 110. The cover section 120 of the housing 100 is not illustrated in FIG. 1. In the example illustrated schematically in FIGS. 1 and 2, the base section 110 and the cover section 120 are each configured in a rectangular fashion. However, this is not absolutely necessary. The base section 110 and the cover section 120 may also be configured with a different shape, for example, in the shape of a circular disk. Wall sections 130 of the housing 100 extend between the base section 110 and the cover section 120, the wall sections being oriented substantially perpendicularly to the base section 110 and the cover section 120 in the example illustrated schematically in FIGS. 1 and 2. However, it is possible for the wall sections 130 of the housing 100 to be oriented differently. By way of example, the cover section 120 of the housing 110 might be configured with a larger area than the base section 110 of the housing 100. In this case, the wall sections 130 would be inclined relative to the base section 110 and the cover section 120 such that the housing 100 widens conically from the base section 110 to the cover section 120. The base section 110, the cover section 120 and the wall sections 130 of the housing 100 enclose an interior 140 of the housing 100.

The housing 100 of the optoelectronic component 10 may, for example, be produced by a molding process and comprise a plastics material. The housing 100 may also comprise a ceramic material, a metallic leadframe or a circuit board on its base section 110. The housing 100 of the optoelectronic component 10 may be configured, for example, as a QFN housing.

The optoelectronic component 10 may be provided as an SMD component for surface mounting, for example, for surface mounting by reflow soldering.

An optoelectronic semiconductor chip 200 is arranged in the interior 140 of the housing 100 of the optoelectronic component 10. The optoelectronic semiconductor chip 200 is configured to emit electromagnetic radiation, for example, visible light. The optoelectronic semiconductor chip 200 is preferably configured as a light emitting diode chip (LED chip).

The optoelectronic semiconductor chip 200 is arranged on the base section 110 of the housing 100 such that a base face 220 of the optoelectronic semiconductor chip 200 faces the base section 110. A radiation emission face 210 of the optoelectronic semiconductor chip 200 located opposite the base face 220 of the optoelectronic semiconductor chip 200 is oriented toward the cover section 120 of the housing 100. Side faces 230 of the optoelectronic semiconductor chip 200 extend between the base face 220 and the radiation emission face 210 of the optoelectronic semiconductor chip 200. The radiation emission face 210 of the optoelectronic semiconductor chip 200 is configured in a substantially square fashion in the example illustrated and comprises an edge length 211. However, it is possible for the radiation emission face 210 to be configured with a different shape. The optoelectronic semiconductor chip 200 is electrically contacted on the base section 110 of the housing 100, for example, by solder connections and/or wire bond connections.

The optoelectronic semiconductor chip 200 may be configured as a surface emitting semiconductor chip. In this case, the optoelectronic semiconductor chip 200 emits electromagnetic radiation only at its radiation emission face 210.

However, the optoelectronic semiconductor chip 200 may, for example, also be configured as a volume emitting semiconductor chip. In this case, the optoelectronic semiconductor chip 200 emits electromagnetic radiation both at the radiation emission face 210 and at its side faces 230.

A wavelength-converting material 500 is arranged on the radiation emission face 210 of the optoelectronic semiconductor chip 200 of the optoelectronic component 10. The wavelength-converting material 500 may be arranged, for example, in the form of a converter lamina on the radiation emission face 210 of the optoelectronic semiconductor chip 200. The wavelength-converting material 500 may also be omitted, however.

The radiation emission face 500 comprises wavelength-converting particles (phosphor particles) configured to convert electromagnetic radiation comprising a wavelength from a first spectral range into electromagnetic radiation comprising a wavelength from a second spectral range. In this case, the wavelength-converting particles of the wavelength-converting material 500 are coordinated with the optoelectronic semiconductor chip 200 such that the wavelength-converting particles may convert electromagnetic radiation emitted by the optoelectronic semiconductor chip 200 into electromagnetic radiation of a different wavelength. A mixture of unconverted radiation of the optoelectronic semiconductor chip 200 and electromagnetic radiation converted by the wavelength-converting material 500 may impart a white color impression, for example. For this purpose, the wavelength-converting material 500 may be configured, for example, to convert electromagnetic radiation emitted by the optoelectronic semiconductor chip 200 and comprising a wavelength from the blue spectral range into electromagnetic radiation comprising a wavelength from the yellow spectral range.

The cover section 120 of the housing 100 of the optoelectronic component 10 comprises an optical element 300. The optical element 300 is an optically imaging element provided to image electromagnetic radiation generated by the optoelectronic semiconductor chip 200 into a target region in the surroundings of the optoelectronic component 10. The optical element 300 comprises an optically transparent material, for example, a glass or a plastics material, for instance PMMA, polycarbonate or an epoxy resin. The optical element 300 comprises an inner side oriented toward the base section 110 of the housing 100 and an outer side 310 located opposite the inner side 320.

The optical element 300 comprises a plurality of optical individual elements 350 arranged alongside one another in the plane of the cover section 120 formed by the optical element 300.

In the example of the optoelectronic component 10 as shown in FIGS. 1 to 3, the optical individual elements 350 of the optical element 300 are configured as optical lenses 360. In particular, the optical individual elements 350 of the optical element 300 are configured as planoconvex converging lenses. The optical individual elements 350 are configured such that they are each convex on the outer side 310 of the optical element 300 and planar on the inner side 320 of the optical element 300. The convex sides of the optical individual elements 350 of the optical element 300 configured as optical lenses 360 may be configured such that they are spherical or aspherical, for example. However, it is also possible for the optical individual elements 350 of the optical element 300 configured as optical lenses 360 to be configured such that they are conical, biconical, toroidal or in some other fashion.

The optical individual elements 350 of the optical element 300 connect to one another in an integrally linked fashion. In this case, the optical individual elements 350 arranged alongside one another are arranged in a regular lattice arrangement, in a hexagonal lattice arrangement in the example illustrated. However, it is also possible to arrange the optical individual elements 350 of the optical element 300 in a different lattice arrangement, for example, in a rectangular lattice arrangement, or in a non-regular arrangement.

A reflective element 400 is arranged between the optoelectronic semiconductor chip 200 of the optoelectronic component 10 and the optical element 300 of the optoelectronic component 10. The reflective element 400 is configured such that it is flat and plate-shaped and oriented substantially parallel to the planar inner side 320 of the optical element 300. Preferably, the reflective element 400 is in contact with the inner side 320 of the optical element 300.

The reflective element 400 is configured such that it is optically reflective both on its side facing the optical element 300 and on its side facing the base section 110 of the housing 100. In this case, the reflective element 400 may be configured such that it is specularly or diffusely optically reflective.

The reflective element 400 may, for example, be laminated on the planar inner side 320 of the optical element 300 or applied as a metallization on the inner side 320 of the optical element 300, for example, by a photolithographic process. However, the reflective element 400 may, for example, also be printed onto the inner side 320 of the optical element 300. In this case, the reflective element 400 may be formed by a white printing ink, for example.

The reflective element 400 comprises a plurality of openings 410 extending through the reflective element 400 between the side of the reflective element 400 facing the base section 110 of the housing 100 and the side of the reflective element 400 facing the inner side 320 of the optical element 300. The reflective element 400 thus forms a diaphragm. The openings 410 of the reflective element 400 form diaphragm apertures.

Preferably, an opening 410 of the reflective element 400 is assigned to each optical individual element 350 of the optical element 300 of the optoelectronic component 10. In this case, the number of openings 410 of the reflective element 400 preferably substantially corresponds to the number of optical individual elements 350 of the optical element 300. The arrangement of the openings 410 of the reflective element 400 preferably corresponds to the arrangement of the optical individual elements 350 of the optical element 300. If the optical individual elements 350 of the optical element 300 are arranged in a regular lattice arrangement, then the openings 410 of the reflective element 400 are also preferably arranged in a regular lattice arrangement, for example, in a rectangular or hexagonal lattice arrangement. In the example shown in FIGS. 1 to 3, the openings 410 of the reflective element 400 are arranged in a hexagonal lattice arrangement.

The openings 410 of the reflective element 400 may comprise round or rectangular cross sections, for example. In this case, each opening 410 of the reflective element 400 comprises a center point 420 and a diameter 411. If the openings 410 of the reflective element 400 comprise rectangular cross sections, then the diameter 411 may be defined as the length of a diagonal of the respective opening 410.

The optical individual elements 350 of the optical element 300 of the optoelectronic component 10 configured as optical lenses 360 may each comprise a focal point 380.

Preferably, the optical individual elements 350 of the optical element 300 and the openings 410 of the reflective element 400 are arranged relative to one another such that the focal point 380 in the case of each optical individual element 350 is spaced apart from the center point 420 of the opening 410 of the reflective element 400, which opening is assigned to the respective optical individual element 350, by a distance 381 of not more than double the diameter 411 of the respective opening 410, preferably by not more than the single diameter 411 of the respective opening 410. This means that the principal axes of the optical individual elements 350 configured as optical lenses 360 extend in a manner spaced by not more than the distance 381 from the center points 420 of the assigned openings 410 of the reflective element 400. The openings 410 of the reflective element 400 are then each imaged into the far field by the assigned optical individual elements 350 of the optical element 300.

It is possible for the focal points 380 of the optical individual elements 350 of the optical element 300 configured as optical lenses 360 not to be configured in point fashion. In this case, the optical lenses merely comprise an extended focal spatial region in which an imaginary parallel beam impinging on the respective optical lens 360 would experience a maximum focusing. Preferably, in this case, for each optical individual element 350, a center point of the focal spatial region is spaced apart from the center point 420 of the opening 410 of the reflective element 400, which opening is assigned to the respective optical individual element 350, by the distance 381 of not more than double the diameter 411 of the respective opening 410, preferably by not more than the single diameter 411 of the respective opening 410.

It is likewise possible for the optical individual elements 350 of the optical element 300 configured as optical lenses 360 to comprise different focal points in different spatial directions. In this case, the opening 410 of the reflective element 400 assigned to the respective optical individual element 350 may be arranged relative to one of the focal points in the manner described above. Alternatively, the opening 410 of the reflective element 400 assigned to the respective optical individual element 350 may be arranged between the focal points of the respective optical individual element 350.

The base section 110 of the housing 100 and the wall sections 130 of the housing 100 of the optoelectronic component 10 are preferably configured such that they are optically reflective, for example, specularly or diffusely optically reflective. As a result, the interior 140 of the housing 100 forms a light box, at whose walls formed by the base section 110, the wall sections 130 and the reflective element 400 light may be reflected many times and may thereby be homogeneously intermixed. Air may be situated between the optoelectronic semiconductor chip 200 and the reflective element 400.

During operation of the optoelectronic component 10, at the radiation emission face 210 of the optoelectronic semiconductor chip 200 or at the wavelength-converting material 500 arranged on the radiation emission face 210 of the optoelectronic semiconductor chip 200, light is emitted into a wide solid angle range. FIG. 3 shows a path of two such emitted light rays 11 in schematic illustration. The light rays 11 emitted by the optoelectronic semiconductor chip 200 are reflected in the interior 140 of the housing 100 at the side of the reflective element 400 facing the base section 110 of the housing 100, at the wall sections 130 of the housing 100 and at the base section 110 of the housing 100 until they pass through one of the openings 410 of the reflective element 400 and are directed by the optical individual element 350 of the optical element 300 assigned to the respective opening 410 of the reflective element 400 into the target region in the surroundings of the optoelectronic component 10.

FIG. 3 also shows in schematic illustration an outer light ray 12 impinging on the cover section 120 of the housing 100 of the optoelectronic component 10 from outside from the surroundings of the optoelectronic component 10. The outer light ray 12 impinges on one of the optical individual elements 350 of the optical element 300 configured as optical lenses 360. The outer light ray, in so far as it does not impinge on the optical individual element 350 at an angle from a narrow angle range defined by the respective optical individual element 350, is deflected by the optical individual element 350 to the reflective element 400, but not to the opening 410 of the reflective element 400 assigned to the respective optical individual element 350. The outer light ray 12 deflected to the reflective element 400 by the optical individual element 350 is reflected at the reflective element 400 and reflected back into the surroundings of the optoelectronic component 10 by the optical element 300.

This has the consequence that the cover section 120 of the housing 120 of the optoelectronic component 10, as viewed from outside, has a substantially diffusely or specularly reflective effect. However, the interior 140 of the housing 100 of the optoelectronic component 10 and the optoelectronic semiconductor chip 200 arranged in the interior 140 of the housing 100 are not visible, or scarcely visible, from the surroundings of the optoelectronic component 10.

The optical individual elements 350 of the optical element 300 of the optoelectronic component 10 may all be configured identically to one another. By way of example, the optical individual elements 350 of the optical element 300 configured as optical lenses 360 may each be configured such that each optical individual element 350 light incident through the opening 410 of the reflective element 400 assigned to the respective optical individual element 350 is emitted as a parallel beam oriented substantially perpendicularly to the cover section 120 of the housing 100 of the optoelectronic component 10. However, it is also possible for the optical individual elements 350 of the optical element 300 to be configured differently. By way of example, different optical individual elements 350 of the optical element 300 may be provided to direct light emitted by the optoelectronic component 10 into different regions of a target region to be illuminated by the optoelectronic component 10.

In the example of the optoelectronic component 10 as illustrated in FIGS. 1 to 3, the principal axes of the optical individual elements 350 configured as optical lenses 360 and extend apart from the distance 381 through the center points 420 of the openings 410 of the reflective element 400 assigned to the optical individual elements 350 are all oriented perpendicularly to the base section 110 of the housing 100 and the radiation emission face 210 of the optoelectronic semiconductor chip 200. The optical element 300 and the reflective element 400 are configured such that they are substantially planar. However, it is also possible for the principal axes of at least some optical individual elements 350 of the optical element 300 to be targeted relative to the base section 110 of the housing 100 and the radiation emission face 210 of the optoelectronic semiconductor chip 200. In this case, the optical element 300 may be curved, for example.

The cross-sectional shape of the openings 410 of the reflective element 400 may influence the light distribution in the target region to be illuminated by the optoelectronic component 10. Preferably, the openings 410 of the reflective element 400 comprise a round or a rectangular, for example, a square, cross section.

The optical element 300 of the optoelectronic component 10 comprises a thickness 301 between its inner side 320 and its outer side 310 in the example illustrated in FIGS. 1 to 3. The thickness 301 of the optical element 300 is preferably less than 500 μm, particularly preferably less than 200 μm. By way of example, the thickness 301 of the optical element 300 may be 100 μm.

The optical element 300 of the optoelectronic component 10 in the example shown in FIGS. 1 to 3 comprises an edge length 302 measured parallel to the base section 110 of the housing 100. Preferably, the edge length 302 of the optical element 300 is at most three times the magnitude of the edge length 211 of the radiation emission face 210 of the optoelectronic semiconductor chip 200, particularly preferably at most twice the magnitude thereof.

In the example of the optoelectronic component 10 as illustrated in FIGS. 1 to 3, the inner side 320 of the optical element 300 comprises a distance 303 from the wavelength-converting material 500 arranged on the radiation emission face 210 of the optoelectronic semiconductor chip 200. The distance 303 is preferably less than 500 μm, particularly preferably less than 200 μm. By way of example, the distance 303 may be 100 μm.

In the example of the optoelectronic component 10 as shown in FIGS. 1 to 3, the optical individual elements 350 of the optical element 300 each are at a distance 351 from one another. Preferably, the distance 351 between the optical individual elements 350 is greater than half of the thickness 301 of the optical element 300. The distance 351 between the individual optical individual elements 350 of the optical element 300 is likewise preferably less than three times the thickness 301 of the optical element 300.

Alongside the optoelectronic semiconductor chip 200, one or more further optoelectronic semiconductor chips may be arranged in the interior 140 of the housing 100 of the optoelectronic component 10. The optoelectronic semiconductor chip 200 and the further optoelectronic semiconductor chips are in this case arranged alongside one another on the base section 110 of the housing 100 and may be spaced apart from one another.

The further optoelectronic semiconductor chips may be configured identically to the optoelectronic semiconductor chip 200. However, the further optoelectronic semiconductor chips may also be configured to emit light comprising a different wavelength than the optoelectronic semiconductor chip 200.

Wavelength-converting material may each be arranged on the radiation emission faces of the further optoelectronic semiconductor chips, the wavelength-converting material being configured identically to or differently than the wavelength-converting material 500 on the radiation emission face 210 of the optoelectronic semiconductor chip 200.

The configuration of the interior 140 of the housing 100 as a light box comprising the reflective base section 110, the reflective wall sections 130 and the reflective element 400 brings about homogeneous intermixing of the light portions emitted by the individual optoelectronic semiconductor chips in the interior 140 of the housing 100. What may be achieved thereby is that the light emitted by the optoelectronic component 10 into the target region to be illuminated comprises a substantially homogeneous color mixing in all partial regions of the target region.

Alternative examples of the optoelectronic component 10 are described below with reference to FIGS. 4 to 10. These alternative examples of the optoelectronic component 10 correspond, apart from the configurations explained below, to the example of the optoelectronic component as described above with reference to FIGS. 1 to 3. In this respect, the above description also applies to the examples of the optoelectronic component 10 disclosed below. By way of example, in each configuration of the optoelectronic component 10, a plurality of optoelectronic semiconductor chips may be present.

Figure 4:
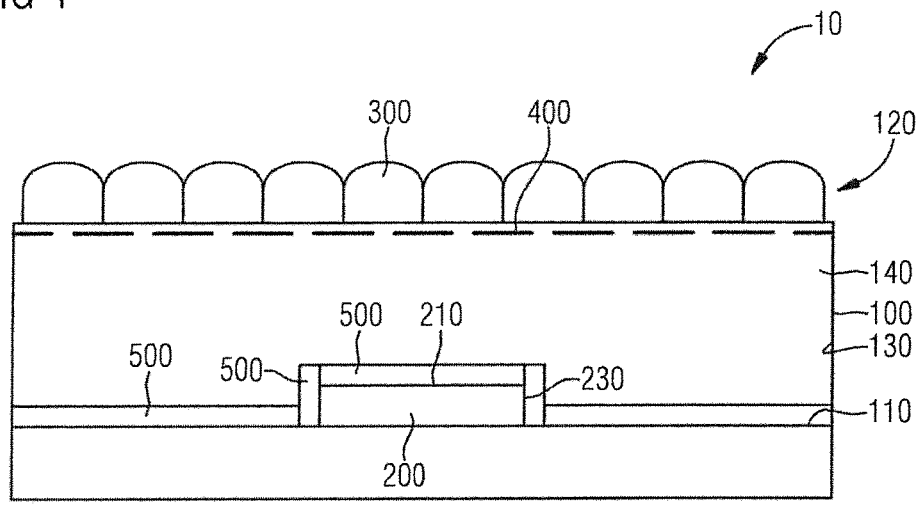
FIG. 4 shows a sectional side view of another optoelectronic component.

FIG. 4 shows a schematic sectional side view of the optoelectronic component 10 in an alternative example. In the example shown in FIG. 4, the wavelength-converting material 500 is not just arranged on the radiation emission face 210 of the optoelectronic semiconductor chip 200, but also extends over the side faces 230 of the optoelectronic semiconductor chip 200 and the base section 110 of the housing 100. However, it would also be possible to dispense with the provision of the wavelength-converting material 500 either in the region of the side faces 230 of the optoelectronic semiconductor chip 200 or in the region of the base section 110 of the housing 100.

Figure 5:
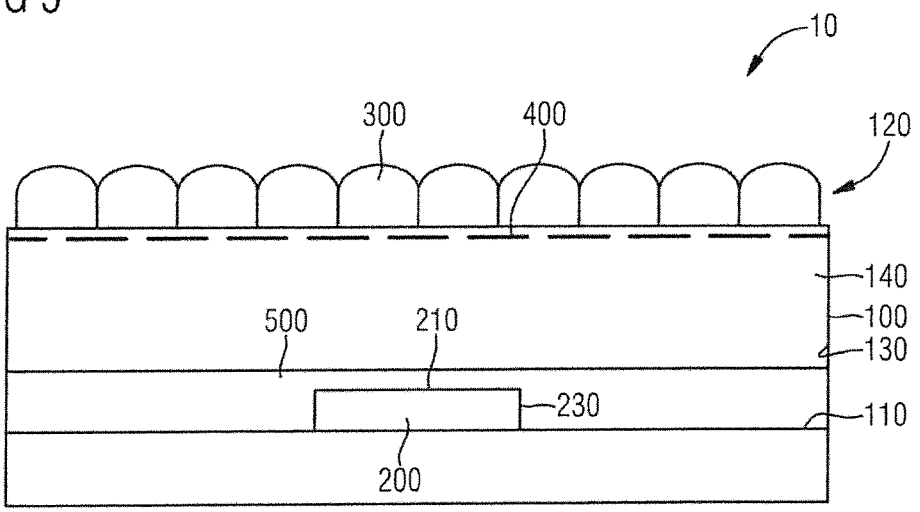
FIG. 5 shows a sectional side view of another optoelectronic component.

FIG. 5 shows a schematic sectional side view of the optoelectronic component 10 in a further alternative example. In the example illustrated in FIG. 5, a thick layer of the wavelength-converting material 500 is arranged on the base section 110 of the housing 100. The optoelectronic semiconductor chip 200 is embedded into the thick layer of the wavelength-converting material 500 such that both the side faces 230 and the radiation emission face 210 of the optoelectronic semiconductor chip 200 are covered by the wavelength-converting material 500.

Figure 6:
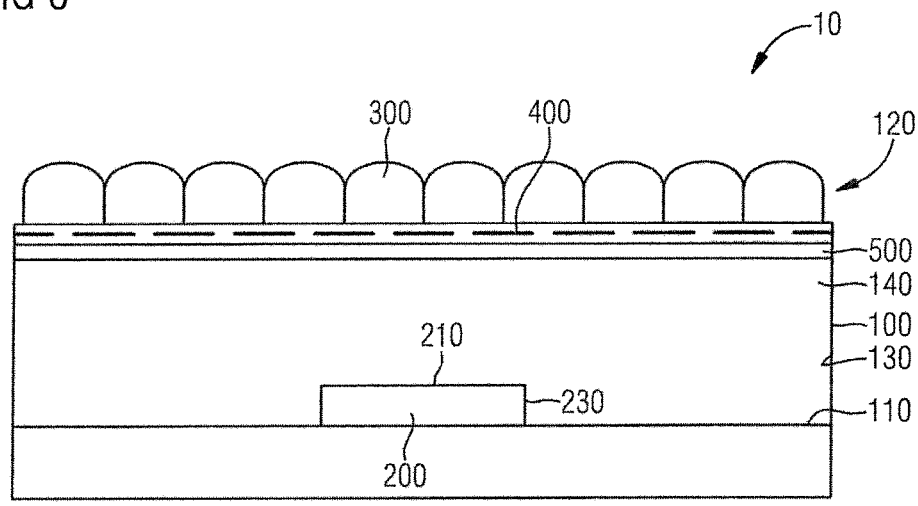
FIG. 6 shows a sectional side view of another optoelectronic component.

FIG. 6 shows a schematic sectional side view of the optoelectronic component 10 in a further alternative example of the optoelectronic component 10. In the example shown in FIG. 6, no wavelength-converting material 500 is arranged on the radiation emission face 210 of the optoelectronic semiconductor chip 200. Instead, the wavelength-converting material 500 is arranged on that side of the reflective element 400 facing the interior 140 of the housing 100 and the optoelectronic semiconductor chip 200. In the example illustrated in FIG. 6, therefore, light emitted by the optoelectronic semiconductor chip 200 is converted into light of a different wavelength only upon impinging on the wavelength-converting material 500 arranged on the reflective element 400.

In the example illustrated in FIG. 6, the reflective element 400, on its side facing the interior 140 of the housing 100, is completely covered by the wavelength-converting material 500. In this case, the wavelength-converting material 500 also extends over the openings 410 of the reflective element 400. It is possible, however, to limit the wavelength-converting material 500 to the region of the openings 410 of the reflective element 400 such that the openings 410 of the reflective element 400 are each covered by the wavelength-converting material 500, but the reflective element 400 in the regions between the openings 410 is in part not covered by the wavelength-converting material 500.

Applying the wavelength-converting material 500 to the reflective element 400 may be carried out, for example, by a printing method or a spraying method. If the reflective element 400 is intended not to be completely covered by the wavelength-converting material 500, a mask, for example, may be used in this case.

Figure 7:
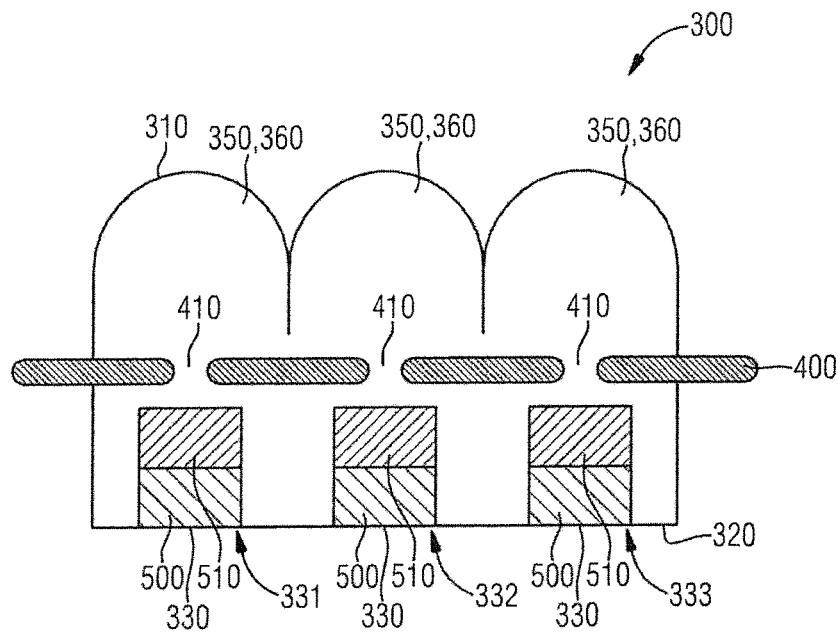
FIG. 7 shows a sectional side view of another optical element of the optoelectronic component.

FIG. 7 shows a schematic sectional side view of parts of the optical element 300 and of the reflective element 400 of a further alternative example of the optoelectronic component 10. In the example shown in FIG. 7, the reflective element 400 is at least partly embedded into the optical element 300. The reflective element 400 may be configured in this case, for example, as a reflective metal sheet comprising the openings 410 (perforated sheet).

In the example shown in FIG. 7, the optical element 300 may be produced, for example, by a molding process. In this case, the reflective element 400 is already embedded into the optical element 300 during the formation of the optical element 300. The material of the optical element 300 is molded around the reflective element 400.

The reflective element 400 is embedded into the optical element 300 such that the optical individual elements 350 of the optical element 300 are arranged on one side of the reflective element 400. In the example shown in FIG. 7, too, the optical individual elements 350 of the optical element 300 are configured as optical lenses 360. The relative arrangement of the openings 410 of the reflective element 400 and of the optical individual elements 350 and of their focal points 380 is preferably as in the example of the optoelectronic component 10 as described with reference to FIGS. 1 to 3.

The optical element 300 additionally comprises cavities 330 in the example shown in FIG. 7, but the cavities may also be omitted in a simplified configuration. That part of the optical element 300 shown in FIG. 7 comprises a first cavity 330, 331, a second cavity 330, 332 and a third cavity 330, 333. The cavities 330 are arranged on that side of the reflective element 400 embedded into the optical element 300 located opposite the optical individual elements 350. In this case, the cavities 330, on the inner side 320 of the optical element 300, are opened toward the interior 140 of the housing 100. Preferably, a dedicated cavity 330 is assigned to each optical individual element 350 of the optical element 300 and each opening 410 of the reflective element 400.

A wavelength-converting material 500 is respectively arranged in the cavities 330 of the optical element 300. In an example of the optoelectronic component 10 comprising the optical element 300 and the reflective element 400 shown in FIG. 7, it is therefore not necessary to provide wavelength-converting material 500 on the radiation emission face 210 of the optoelectronic semiconductor chip 200. The wavelength-converting material 500 may be arranged in the cavities 330 of the optical element 300 by a metering method, for example.

It is possible to provide the same wavelength-converting material 500 in all the cavities 330 of the optical element 300. However, it is also possible to arrange different wavelength-converting material 500 in different cavities 330 of the optical element 300, the wavelength-converting material being configured, for example, to convert electromagnetic radiation into electromagnetic radiation of different wavelengths. In the example illustrated in FIG. 7, a first type of the wavelength-converting material 500 is arranged in the first cavity 330, 331 and the third cavity 330, 333, while a second type of the wavelength-converting material 500 is arranged in the second cavity 330, 332.

In addition to the wavelength-converting material 500, further material may be arranged in the cavities 330 of the optical element 300 of the example shown in FIG. 7. By way of example, reflective particles and/or a diffusely scattering material 510 may be arranged in the cavities 330. In the example shown in FIG. 7, in addition to the wavelength-converting material 500 a diffusely scattering material 510 is arranged in the cavities 330. The diffusely scattering material 510 is each arranged closer to the reflective element 400 embedded into the optical element 300 than the wavelength-converting material 500. However, the diffusely scattering material 510 may also be omitted.

Figure 8:
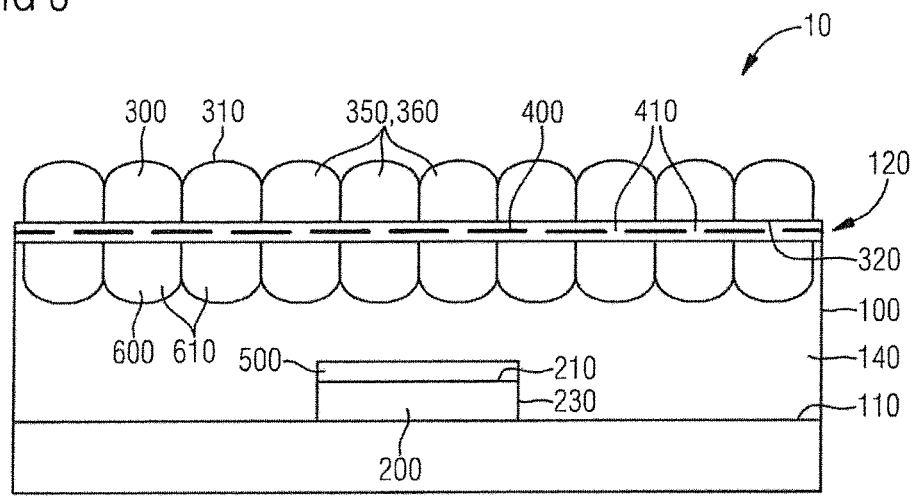
FIG. 8 shows a sectional side view of another optoelectronic component.

FIG. 8 shows a schematic sectional side view of a further example of the optoelectronic component 10. The example of the optoelectronic component 10 as illustrated in FIG. 8 corresponds to the example of the optoelectronic component 10 illustrated in FIG. 3, apart from the differences explained below.

In the example of the optoelectronic component 10 shown in FIG. 8, the optoelectronic component comprises a further optical element 600 in addition to the optical element 300. The further optical element 600 is arranged on that side of the reflective element 400 facing the interior 140 of the housing 100 and the optoelectronic semiconductor chip 200. Preferably, the further optical element 600 is in direct contact with the reflective element 400. In this case, the reflective element 400 is embedded between the optical element 300 and the further optical element 600. The further optical element 600 may be configured in a manner integrally linked to the optical element 300.

The further optical element 600 comprises a plurality of further optical individual elements 610 configured as optical lenses in the example illustrated. Preferably, a further optical individual element 610 of the further optical element 600 is assigned to each opening 410 of the reflective element 400. The further optical individual elements 600 are provided to direct electromagnetic radiation from the interior 140 into the openings 410 of the reflective element 400. For this purpose, the further optical individual elements 610 may be configured, for example, as converging lenses, in particular, for example, as planoconvex converging lenses.

In the example of the optoelectronic component 10 shown in FIG. 8, the wavelength-converting material 500 might also be arranged as in the example of the optoelectronic component 10 shown in FIG. 4 or as in the example of the optoelectronic component 10 shown in FIG. 5.

Figure 9:
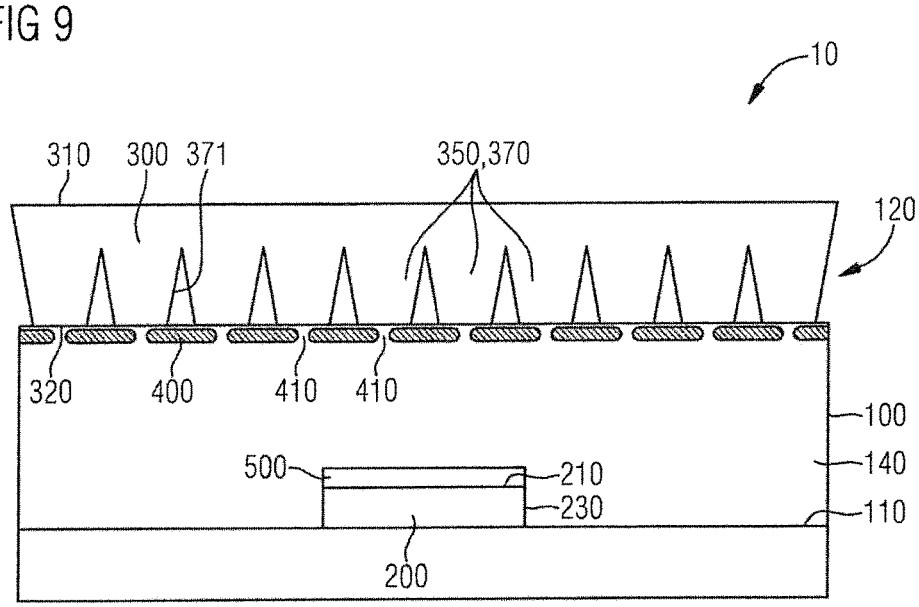
FIG. 9 shows a sectional side view of another optoelectronic component.

FIG. 9 shows a schematic sectional side view of a further example of the optoelectronic component 10. The example of the optoelectronic component 10 shown in FIG. 9 corresponds to the example of the optoelectronic component 10 shown in FIG. 3, apart from the deviations explained below.

In the example shown in FIG. 9, the optical individual elements 350 of the optical element 300 of the optoelectronic component 10 are configured as optical tapers 370. The optical tapers 370 may also be referred to as reflectors. Each optical taper 370 widens conically from the inner side 320 of the optical element 300 to the outer side 310 of the optical element 300. In this case, each optical taper 370 comprises an outer face 371 which extends between the inner side 320 and the outer side 310 of the optical element 300 and which forms a lateral surface of the conically widening optical taper 370.

Electromagnetic radiation propagating from the interior 140 of the housing 100 of the optoelectronic component 10 through one of the openings 410 of the reflective element 400 into one of the optical individual elements 350 of the optical element 300 configured as optical tapers 370 is subjected to total internal reflection within the respective optical individual element 350 at the outer face 371 and is thereby guided to the outer side 310 of the optical element 300, where it may emerge from the optical individual element 350 of the optical element 300.

Figure 10:
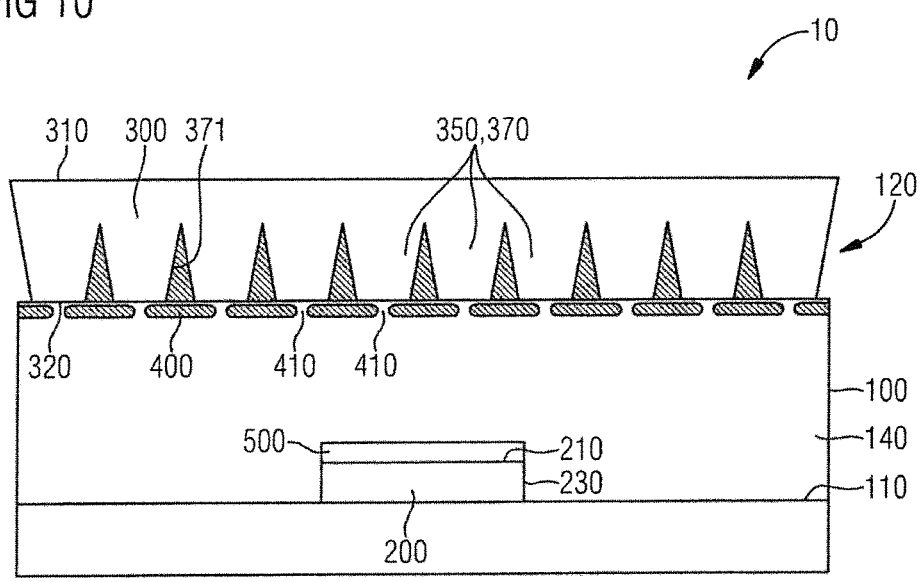
FIG. 10 shows a sectional side view of another optoelectronic component.

FIG. 10 shows a schematic sectional side view of a further example of the optoelectronic component 10. The example of the optoelectronic component 10 shown in FIG. 10 corresponds to the example of the optoelectronic component 10 shown in FIG. 9, apart from the differences explained below.

In the example illustrated in FIG. 10, a reflective material is arranged on the outer faces 371 of the optical individual elements 350 of the optical element 300 configured as optical tapers 370. Electromagnetic radiation that penetrates from the interior 140 of the housing 100 of the optoelectronic component 10 through one of the openings 410 of the reflective element 400 into one of the optical individual elements 350 of the optical element 300 is reflected at the reflective material arranged between the individual optical individual elements 350 and is thereby transported within the respective optical individual element 350 to the outer side 310 of the optical element 300, where it may emerge from the optical element 300 and is emitted into the target region illuminated by the optoelectronic component 10.

In the examples of the optoelectronic component 10 shown in FIGS. 9 and 10, the wavelength-converting material 500 may alternatively be arranged as in one of the examples shown in FIGS. 4, 5 and 6. The optical element 300 of the examples of the optoelectronic component 10 shown in FIGS. 9 and 10 may also be combined with a further optical element 600 such as is illustrated in the example of the optoelectronic component 10 shown in FIG. 8.

In all the examples of the optoelectronic component 10 explained, the cover section 120 and the wall sections 130 of the housing 100 may be configured in an integrally linked fashion. In this case, the cover section 120 and the wall sections 130 linked integrally with the cover section 120 may be arranged as a cover on the base section 110 of the housing 100. Alternatively, however, the base section 110 and the wall sections 130 of the housing 100 may also be configured in an integrally linked fashion. In this case, after arranging the optoelectronic semiconductor chip 200 on the base section 110 the cover section 120 is used to complete the housing 100.

Our components have been illustrated and described in greater detail on the basis of preferred examples. Nevertheless, this disclosure is not restricted to the examples disclosed. Rather, other variations may be derived therefrom by those skilled in the art without departing from the scope of protection of the appended claims.

This application claims priority of DE 10 2014 113 275.0, the subject matter of which is hereby incorporated by reference.

The invention claimed is:

1. An optoelectronic component comprising a housing comprising a base section and a cover section that delimit an interior of the housing,
   wherein an optoelectronic semiconductor chip is arranged on the base section,
   the cover section is formed by an optical element comprising a plurality of optical individual elements arranged alongside one another,
   a reflective element comprising openings is arranged between the optoelectronic semiconductor chip and an outer side of the optical element,
   an opening of the reflective element is assigned to each optical individual element of the optical element, and
   each optical individual element comprises a focal point spaced apart from a center point of the assigned opening of the reflective element by not more than double the diameter of the opening by not more than the single diameter of the opening.

2. The optoelectronic component according to claim 1, wherein the reflective element is configured such that it is specularly or diffusely reflective.

3. The optoelectronic component according to claim 1,
   wherein the optical element comprises a planar side facing the optoelectronic semiconductor chip, and
   the reflective element is arranged on the planar side.

4. The optoelectronic component according to claim 3, wherein the reflective element is laminated, printed or applied as a metallization on the planar side of the optical element.

5. The optoelectronic component according to claim 1, wherein the reflective element is at least partly embedded into the optical element.

6. The optoelectronic component according to claim 5,
   wherein the optical element comprises a plurality of cavities arranged between the optoelectronic semiconductor chip and the reflective element, and
   a wavelength-converting material is respectively arranged in the cavities.

7. The optoelectronic component according to claim 1, wherein the openings of the reflective element comprise a round or a rectangular cross section.

8. The optoelectronic component according to claim 1, wherein the openings of the reflective element are arranged in a regular lattice arrangement, a rectangular lattice arrangement or a hexagonal lattice arrangement.

9. The optoelectronic component according to claim 1, wherein the optical individual elements are configured as optical lenses.

10. The optoelectronic component according to claim 1, wherein the optical individual elements are configured as optical tapers.

11. The optoelectronic component according to claim 1, wherein the optical individual elements of the optical element differ from one another.

12. The optoelectronic component according to claim 1, wherein a wavelength-converting material is arranged on a radiation emission face of the optoelectronic semiconductor chip and/or on side faces of the optoelectronic semiconductor chip perpendicular to the radiation emission face, and/or on the base section of the housing and/or on a side of the reflective element facing the optoelectronic semiconductor chip.

13. The optoelectronic component according to claim 1, wherein the base section is configured such that it is reflective.

14. The optoelectronic component according to claim 1, wherein the interior is delimited by a wall section extending between the base section and the cover section, said wall section being configured such that it is reflective.

15. The optoelectronic component according to claim 1, wherein the optoelectronic component comprises a further optical element arranged between the optoelectronic semiconductor chip and the reflective element to direct electromagnetic radiation into the openings of the reflective element.

16. The optoelectronic component according to claim 1, wherein a further optoelectronic semiconductor chip is arranged on the base section.

17. The optoelectronic component according to claim 16, wherein the further optoelectronic semiconductor chip is configured to emit light comprising a different wavelength than the optoelectronic semiconductor chip.

18. An optoelectronic component comprising a housing comprising a base section and a cover section that delimit an interior of the housing, wherein an optoelectronic semiconductor chip is arranged on the base section, the cover section is formed by an optical element comprising a plurality of optical individual elements arranged alongside one another, a reflective element comprising openings is arranged between the optoelectronic semiconductor chip and an outer side of the optical element, and the optical individual elements of the optical element differ from one another.

* * * * *

UNITED STATES PATENT AND TRADEMARK OFFICE
CERTIFICATE OF CORRECTION

PATENT NO. : 9,985,188 B2
APPLICATION NO. : 15/510468
DATED : May 29, 2018
INVENTOR(S) : Brick et al.

Page 1 of 1

It is certified that error appears in the above-identified patent and that said Letters Patent is hereby corrected as shown below:

On the Title Page

Please delete "18 Claims, 6 Drawing Sheets" and insert:
--19 Claims, 6 Drawing Sheets--

In the Claims

Column 17, Line 11, please insert Claim 19:
--19. The optoelectronic component according to claim 6, wherein a diffusely scattering material is additionally arranged in at least one of the cavities--

Signed and Sealed this
Sixteenth Day of July, 2019

Andrei Iancu
*Director of the United States Patent and Trademark Office*